United States Patent [19]
Yu

[11] Patent Number: 5,614,794
[45] Date of Patent: Mar. 25, 1997

[54] HORIZONTAL DEFLECTION CIRCUIT FOR A MULTISYNC MONITOR

[75] Inventor: Ming-teh Yu, Taipei, Taiwan

[73] Assignee: Shamrock Technology Company Limited, Hsien, Taiwan

[21] Appl. No.: 427,008

[22] Filed: Apr. 24, 1995

[51] Int. Cl.[6] .................. G09G 1/04; H01J 29/70
[52] U.S. Cl. ............................. 315/411; 315/408
[58] Field of Search ...................... 315/408, 411

[56] References Cited

U.S. PATENT DOCUMENTS

| | | | |
|---|---|---|---|
| 3,970,780 | 7/1976 | Minoura | 315/411 |
| 4,177,393 | 12/1979 | Förster | 315/408 |
| 5,049,792 | 9/1991 | Oh | 315/411 |

*Primary Examiner*—Gregory C. Issing
*Attorney, Agent, or Firm*—Abelman, Frayne & Schwab

[57] ABSTRACT

A horizontal deflection circuit for a MultiSync™ monitor includes a driver transistor, a driver transformer having a primary windings coupled to the driver transistor, a horizontal output transistor coupled to a secondary windings of the driver transformer, a flyback transformer coupled to an output of the horizontal output transistor, and a current source coupled between a voltage source and the primary windings of the driver transformer for stabilizing an output current of the secondary windings of the driver transformer.

1 Claim, 2 Drawing Sheets

5,614,794

HORIZONTAL DEFLECTION CIRCUIT FOR A MULTISYNC MONITOR

BACKGROUND OF THE INVENTION

The present invention relates to a horizontal deflection circuit for a MultiSync™ monitor, and particularly to a deflection circuit for providing a constant current to a horizontal output transistor of the horizontal deflection circuit.

In recent years, monitors have been widely used by the computer industry. As resolutions of monitors are determined by a corresponding horizontal deflection frequency of the monitor, a MultiSync™ monitor adapted to a variable horizontal deflection frequency in a range of 24 KHz to 82 KHz is manufactured by NEC Corp. However, variations of a horizontal frequency result in a drift of an operating point of a deflection circuit of the monitor and an overheating of a horizontal output transistor in the deflection circuit as well as an undesired delay of response of the horizontal output transistor.

SUMMARY OF THE INVENTION

An objective of the present invention is to provide a horizontal deflection circuit to overcome the specific shortcomings of the conventional MultiSync™ monitors.

According to the present invention, a horizontal deflection circuit for a MultiSync™ monitor includes a driver transistor for receiving a horizontal-frequency signal, a driver transformer having a primary windings series-connected to a collector of the driver transistor, a horizontal output transistor having an input connected to a secondary windings of the driver transformer, a flyback transformer coupled to an output of the horizontal output transistor, and a current source coupled between a voltage source and the primary windings of the driver transformer so that a current flows in the secondary winding of the driver transformer will not fluctuate in response to a variation in frequency of horizontal-deflection signal.

Other objects, advantages, and novel features of the invention will become more apparent from the following detailed description when taken in conjunction with the accompanying drawings.

DETAILED DESCRIPTION OF THE PREFERRED EMBODIMENTS

Figure 3:
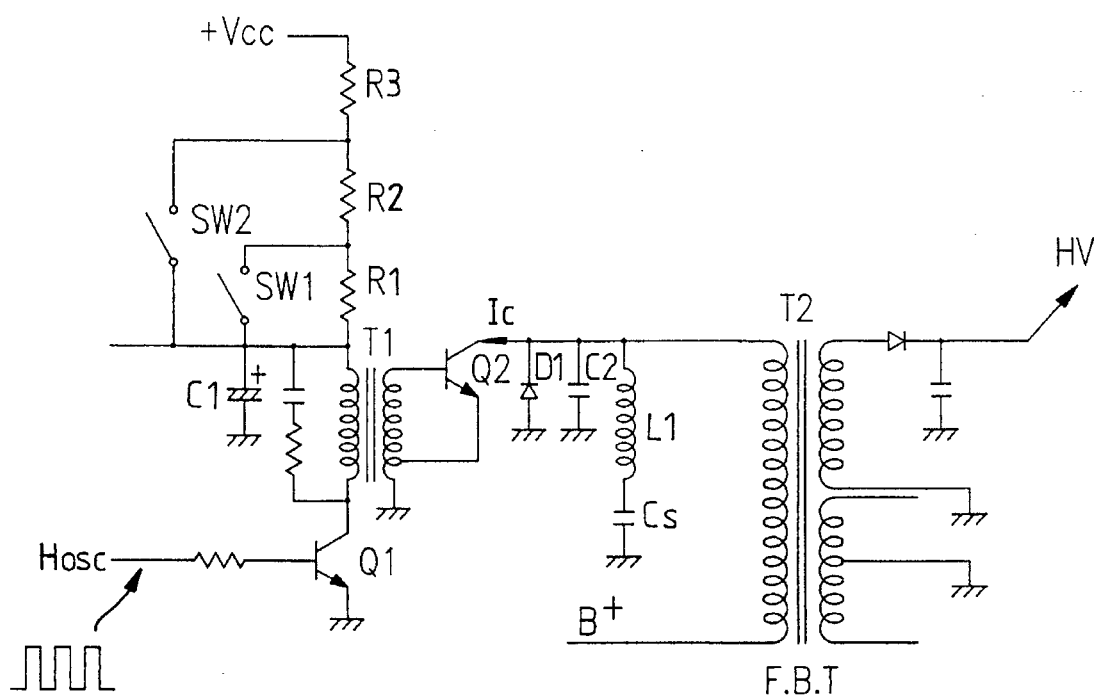
FIG. 3 is a circuit diagram of the horizontal deflection circuit of the conventional MultiSync™ monitor.

FIG. 3 illustrates a horizontal deflection circuit of a conventional MultiSync™ monitor. The horizontal deflection circuit receives a signal $H_{osc}$ from a horizontal oscillator (not shown), the signal $H_{osc}$ is then sent to a base of a driver transistor Q1. A collector of transistor Q1 is coupled to a first end of a primary winding of a driver transformer T1 and an emitter of the transistor Q1 is directly coupled to a ground. A second end of the primary winding of the driver transformer T1 is bypassed to the ground by a filter capacitor C1 and coupled to a voltage source $V_{cc}$ via three series-connected resistors R1, R2, and R3. A switch SW1 is coupled across the resistor R1 and a switch SW2 is connected in parallel to the series-connected resistors R1 and R2.

A secondary winding of transformer T1 is coupled across a base-emitter junction of a horizontal output transistor Q2. A collector of the horizontal output transistor Q2 is coupled to a first end of a primary winding of a horizontal flyback transformer T2 via a damper diode D1, a tuning capacitor C2, a linearity inductor L1, and a trace capacitor $C_s$ that are coupled in a well-known manner.

A supply voltage $B^+$ is coupled to a second end of the primary winding of the flyback transformer T2. During retrace or flyback, flyback pulse voltages are produced in various windings of transformer T2 for producing supply voltages, such as a voltage HV for an anode electrode of a cathode ray tube (CRT).

When a horizontal output transistor Q2 does not have a sufficient speed to achieve switching operations in response of the signal $H_{osc}$, a current Ic in the range of 5–6 amperes or more will flow in a collector of the horizontal output transistor Q2 during operation of the deflection circuit and thus, a temperature of the horizontal output transistor Q2 will rapidly increase. Subsequently, the lifetime of the output transistor Q2 will be shortened or it will even burned out.

Therefore, the horizontal deflection circuit of the conventional MultiSync™ applies the series-connected resistors R1, R2, and R3 in combination of switches SW1 and SW2 to limit a current flowing in the primary winding of the driver transformer T1 thereby preventing damage to the transistor Q2 due to an excess current flow resulting from an increased frequency of the horizontal deflection signal $H_{osc}$.

Thus, if the signal $H_{osc}$ is in a frequency range of 24 KHz to 43 KHz, the switch SW2 will be closed, the resistor R3 will be in series with the primary winding of the transformer T1. If the signal $H_{osc}$ is in a frequency range of 43 KHz to 62 KHZ, the switch SW1 will be closed, the resistors R3 and R2 will be in series with the primary winding of the transformer T1. If the signal $H_{osc}$ is in a frequency range of 62 KHz to 82 KHZ, none of the switches SW1 and SW2 will be closed, the resistors R1, R2, and R3 will be in series with the primary winding of the transformer T1. However, such a conventional circuit arrangement merely offers three optimum operating points corresponding to three specific values of the resistors R1, R2, and R3, it cannot ensure the horizontal output transistor Q2 working in an optimum operating point from time to time.

Those skilled in this art may improve the outcome of the above-mentioned circuit arrangement by applying a larger heat sink attached to the transistor Q2 or by applying more resistors and more switches in a connection analogous to the switches SW1 and SW2 and resistors R1, R2, and R3. However, these two approaches are not the best way to overcome this disadvantage of the conventional deflection circuit, as these two approaches still have the disadvantages of wasting electric power and increasing costs and complexity of circuit resulting from an addition of components.

Figure 1:
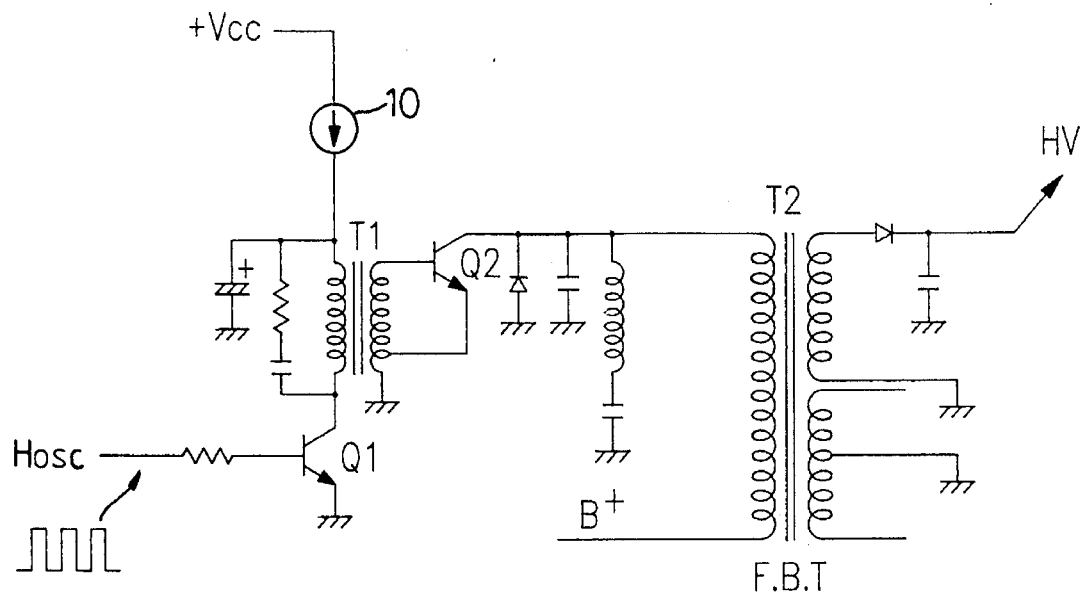
FIG. 1 is a circuit diagram of the horizontal deflection circuit of the present invention.

Referring to FIG. 1, a horizontal deflection circuit according to the present invention is shown. The deflection circuit has a current source 10 connected between the voltage source $V_{cc}$ and the primary winding of the driver transformer T1, the remaining components of the circuit have an identical structure and function to the conventional deflection circuit shown in FIG. 3. Thus, even an impedance of the primary winding of the transformer T1 varies in response to a variation of frequency of signal $H_{osc}$, a current flowing in the primary winding of transformer T1 will remain constant. Therefore, the horizontal output transistor Q2 of the present invention may always work in an optimum operating point.

Further, the circuit arrangement of the present invention may work in an optimum operating point in spite of an error of current gain $h_{FE}$ of the output transistor Q2. That is, even an impedance variation of the primary winding of transformer T1 caused by an error of the current gain $h_{FE}$ occurs, the current source 10 of the present invention may also remain unchanged. Thus, it is apparent that the current gain $h_{FE}$ of the transistor Q2 applied by the present invention may enjoy a higher tolerance range. The present invention therefore has an advantage of convenient to manufacture.

Figure 2:
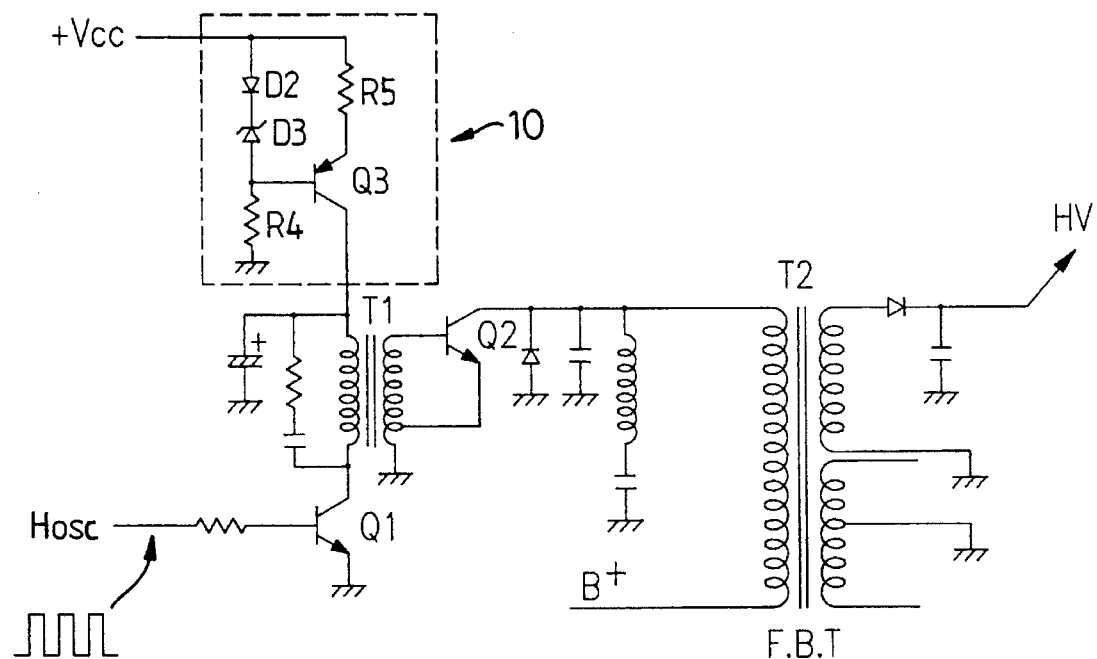
FIG. 2 is a circuit diagram of an embodiment of the present invention.

FIG. 2 is a horizontal deflection circuit in combination with a current source in accordance with the present invention. The current source 10 includes a transistor Q3 having a collector connected to the primary winding of the transformer T1, a base connected to a ground via a resistor R4, and an emitter coupled to the voltage source $V_{cc}$ via a resistor R5, and a diode D2 and a Zener diode D3 connected in series coupled between the voltage $V_{cc}$ and the base of the transistor Q3. Thus, the current flows in the primary winding of the transformer T1 will not fluctuate in response to the frequency variation of the signal $H_{osc}$.

Although the invention has been explained in relation to its preferred embodiment, it is to be understood that many other possible modifications and variations, such as the current source shown may be replaced by a Widlar current source etc., can be made without departing from the spirit and scope of the invention as hereinafter claimed.

I claim:

1. A horizontal deflection circuit for a multisync monitor, comprising;

a driver transistor for receiving a horizontal-frequency signal;

a driver transformer having a primary winding series-connected to a collector of the driver transistor;

a horizontal output transistor having an input connected to a secondary winding of the driver transformer;

a flyback transformer coupled to an output of the horizontal output transistor; and a current source coupled between a voltage source and the primary winding of the driver transformer so that a current flows in the secondary winding of the driver transformer which will not fluctuate in response to a variation in frequency of the horizontal-frequency signal;

wherein said current source comprises a transistor having an emitter coupled to the voltage source via a resistor and a base coupled to the voltage source via a zener diode.

* * * * *